United States Patent [19]

Michel et al.

[11] 4,354,268
[45] Oct. 12, 1982

[54] INTELLIGENT TEST HEAD FOR AUTOMATIC TEST SYSTEM

[75] Inventors: Thomas J. Michel, Hialeah; Richard H. Finger, Hollywood, both of Fla.

[73] Assignee: Santek, Inc., Hollywood, Fla.

[21] Appl. No.: 136,929

[22] Filed: Apr. 3, 1980

[51] Int. Cl.³ .................... G01R 15/12; G06F 11/22
[52] U.S. Cl. ................................. 371/20; 324/73 R; 364/580
[58] Field of Search ................. 371/20; 364/200, 900, 364/580; 324/73 R, 73 AT, 73 PC

[56] References Cited

U.S. PATENT DOCUMENTS

| | | | |
|---|---|---|---|
| 3,764,995 | 10/1973 | Helf, Jr. et al. | 364/200 |
| 4,044,244 | 8/1977 | Foreman et al. | 371/20 |
| 4,055,801 | 10/1977 | Pike et al. | 324/73 R |
| 4,168,527 | 9/1979 | Winkler | 364/580 |

OTHER PUBLICATIONS

"J325 Digital I. C. Test System" F580 Teradyne, Inc. Boston, Mass.
"J133 D Analogical Circuit Test Instrument" F 171D Teradyne, Inc. Boston, Mass. 1976.
Ring "A Distributed Intelligence Automatic Test System for Patriot" *IEEE Transactions on Aerospace & Electronic Systems,* vol. AES-13, No. 3, May 1977 pp. 264–272.
Mscope 820 Microprocessor System Console Operator's Handbook Intel. Corp. 1978.
Mscope 820 Microprocessor System Console 8085 Probe Operator's Handbook 1978, Intel. Corp.

*Primary Examiner*—David H. Malzahn
*Attorney, Agent, or Firm*—Michael Ebert

[57] ABSTRACT

An intelligent test head which can be plugged into an existing computer-controlled automatic test system that is adapted to carry out certain tests on integrated circuits and discrete devices, the test head making it possible for the system to execute special tests which the system is otherwise incapable of performing. The existing system includes a main frame computer associated with a programmer. A device under test is linked by a pin electronics board to the computer through a relay interface board which acts to selectively couple a forcing supply, a function generator or other testing sources to the device, which sources are appropriate to the normal test capabilities of the system. When plugged into the system, the intelligent test head is interposed between the pin electronics board and the device then under test. The head includes a microprocessor and firmware associated therewith which stores the various test functions and the necessary timing and sequencing for the special tests, the head also being provided with a function generator and other testing sources. The microprocessor is intercoupled with the main frame computer through a translation module so that data acquired by the special function test head can be translated into the same machine language format that the main frame computer uses to communicate within itself.

4 Claims, 5 Drawing Figures

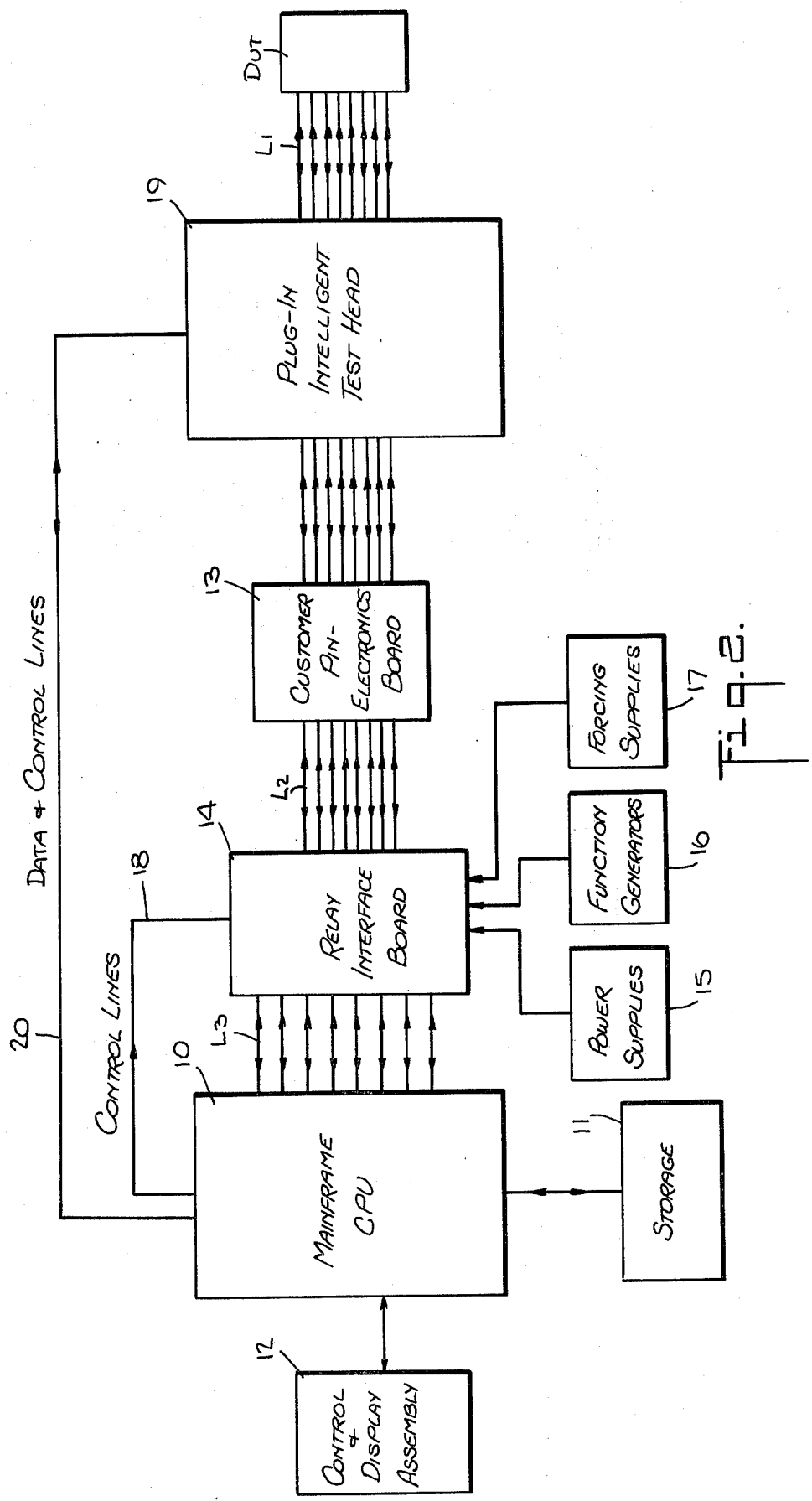

INTELLIGENT TEST HEAD FOR AUTOMATIC TEST SYSTEM

BACKGROUND OF THE INVENTION

This invention relates generally to computer-controlled automatic test systems for testing integrated circuit and discrete devices, and more particularly to a plug-in intelligent test head adapted to execute special tests on an existing automatic test system which it is not otherwise capable of carrying out.

In the large-scale production of modern electronic equipment, component inspection is mandatory. In recent years, the tendency in quality control procedures is away from sample testing of components and toward 100% inspection. The practical reason for this is that some lots of components, when individually tested, may contain as many as 5% rejects. Merely sampling a lot of this character will not extract all bad components; hence bad components will go into the production line, and these must be identified and replaced during or after production.

Experience has demonstrated that finding a bad component at a board test is about ten times more expensive than finding it during an incoming inspection; whereas finding it in a system test costs 100 times as much. And if the bad part is not located until the equipment reaches the field, it will cost about 1,000 as much to find and replace it.

A major function, therefore, of commercially-available computer-controlled automatic test systems which make possible 100% incoming inspection of integrated circuit and discrete devices is the acquisition of the best quality devices for a given application at the lowest possible price. Typical of automatic test systems of the type now available is the Teradyne J 283 circuit test system manufactured by Teradyne, Inc. of Boston, Mass. The J 283 test system is capable of testing almost all types of digital integrated circuits, hybrid devices and other forms of digital modules and printed circuit boards. This tester consists of three major elements; namely, a computer controller with its associated input/output equipment and software; the main frame; and one or more satellites, each satellite being coupled to various test stations.

In addition to a range of automatic test systems being marketed by Teradyne, test systems are also available from Fairchild, Lorlin Industries, LTX and other companies. These are designed to test either linear or analog circuits, or digital circuits, but never both types with any degree of flexibility. The primary reason why all of the possible functions necessary to carry out testing on both linear and digital circuits are not incorporated in a single automatic test system of the type presently available is cost; for a main frame tester of the above type has a selling price that runs as high as $750,000. Moreover, these computer-controlled testers require extensive software support which can easily multiply the initial cost by a factor of three or four.

The main concern of the present invention is the inability of commercially-available computer-controlled automatic test systems to perform one or several specialized or non-standard tests that lie beyond their existing capabilities. As a consequence, an electronic equipment manufacturer may have a half-million dollar automatic test system on his production floor capable of testing a family of IC devices and yet be unable to perform certain essential tests on his supply of components.

One approach heretofore taken by manufacturers toward solving this problem is to design in-house and construct "stand-alone" systems and hand-insert the integrated circuit devices therein so that the necessary specialized tests may be run on the devices. Because of the substantial investment entailed in manpower, time and capital equipment in order to effect testing in this manner, this in-house approach leaves much to be desired from the production standpoint and in economic terms.

Another approach heretofore attempted by some manufacturers who have made a heavy investment in an automatic test system that is incapable of carrying out certain nonstandard yet necessary tests, is to install special electronic modules on the performance boards of the main frame tester and to use the main frame tester to control, to acquire and to process data from the modules. In general, these attempts have not produced satisfactory results. This is because of the basic structure of the main frame tester. In the software or system architecture of existing computer-controlled automatic test systems, no allowances are made for the additional commands that it would take to drive special electronic modules connected to the pin electronics of the performance boards. By reason of this limitation, it is not a simple or easy matter to build a test module and integrate it with the main frame tester.

Accordingly, the present invention is directed to both the problem of economically expanding the test capabilities of a main frame test computer and the problem of control and data usage within the main frame with a minimum of software rewrite.

Another serious limitation of existing automatic digital test systems, such as the Fairchild "Sentry" and certain Teradyne testers, is that in these testers the digital stimulus for the device under test in some cases dictates that very high currents be sequentially switched on and off at relatively high rates, thereby giving rise to electrical noise.

Because of current noises generated in this manner in the test instrument, it is usually impossible, as a practical matter, to operate a digital-based main frame tester to carry out any kind of low level analog or linear testing; for the signal-to-noise ratio is then unfavorable. The current switching pulses in such test arrangements are usually fed through the electrical conductors, and the resultant inductive and/or transient noises act to mask or degrade precision low-level measurement.

To illustrate the limitations of existing automatic techniques for testing integrated circuits, we shall now consider the problem of testing a basic, integrated-circuit device used in telecommunications. This device is the integrated-circuit "codec" chip or coder-decoder.

As pointed out in the article on "IC's for Telecommunications," appearing in *Electronics Design,* Apr. 12, 1979, codec chip sets are probably the most technically demanding of all telecom IC's; for here the analog and digital worlds of communication come together. At the channel's transmission end, a codec serves to encode or translate the analog voice signal into an appropriate PCM code; while at the receiving end, a codec decodes and thereby reforms voice signals from the transmitted digital signal.

One procedure heretofore practiced in testing codec's is to carry out digital testing of the codec chip on a digital main frame test computer and then remove the chip and transfer it into an analog instrument test rack. The total hardware cost involved in providing separate and distinct digital and analog testers for this purpose may run as high as a million dollars. An alternative practice is for the manufacturer to purchase a specialized tester capable only of testing codec's, but this tester generally costs over $300,000. Because existing general purpose computer-controlled digital test systems are incapable of carrying out all of the requisite tests on a codec chip, the testing of such chips has hitherto been, for the reasons explained above, a highly expensive proposition.

SUMMARY OF INVENTION

In view of the foregoing, the main object of this invention is to provide an intelligent test head which can be plugged in or otherwise introduced into an existing computer-controlled automatic test system adapted to carry out certain tests on integrated circuit and discrete devices, the inserted test head making it possible for the system to execute special tests on a device the system is otherwise incapable of performing.

More particularly, an object of this invention is to provide an intelligent test head of the above-noted type which is an independent functioning unit and includes its own forcing, functions and power supplies, as well as clocks, synchronization system, frequency synthesizers, generators, and all other required testing sources, the test head being capable of carrying out all the tests it was designed to perform on the device under test without reliance on the main frame computer.

A significant aspect of the invention is that the output of the test head is digital data and, in some instances, analog representations of this data. This output assumes the form of an electrical signal and not directly-interpretable test results; for this signal is then interpreted by the main frame computer, and in some cases evaluated in conjunction with other sets of data that the main frame computer has derived from the device under test.

Also an object of the invention is to provide an intelligent test head which operates efficiently and reliably in conjunction with an existing computer-controlled automatic test system, which test head can be manufactured at relatively low cost and yet make it possible for the system to carry out special tests on a device which it could not otherwise perform. Thus a typical test head in accordance with the invention adapted to do a set of six specialized AC functions is estimated to cost from 10 to 20 thousand dollars; whereas if it were necessary to purchase a completely new main frame computer to execute these specialized tests, the cost would run anywhere from $350,000 to $500,000, to which must be added the cost of the software-support needed to get the main frame computer on line.

A salient advantage of a plug-in test head in accordance with the invention is that it makes it possible to avoid multiple insertion testing wherein one piece of test equipment is required to perform one set of test parameters on a device which must then be removed from equipment and manually or automatically transferred and plugged into another piece of test equipment to run another set of test parameters.

Because of the extensive handling requirements for the device under test, high labor costs and other factors involved in multiple insertion testing, this is an inordinately expensive procedure. With a head according to the invention that attaches to the pin electronics board of a main frame test computer and runs data lines back to the main frame computer's communication bus, it becomes feasible to use the test computer for a multiplicity of test purposes far beyond its normal capability, thereby obviating multiple insertion testing and the drawbacks incident thereto.

Briefly stated, these objects are attained in an intelligent test head which can be plugged into an existing computer-controlled automatic test system that is adapted to carry out certain tests on integrated circuits and discrete devices, the test head making it possible for the system to execute special tests on a device which the system is otherwise incapable of performing.

The system includes a main frame computer which is software programmable, the device under test being linked by a pin electronics board to the computer through a relay interface board which acts to selectively couple the device to a forcing supply, an oscillator, a function ramp, timing and sync generators, and clocks and other testing sources to perform various tests on the device.

When plugged into the system, the intelligent test head is interposed between the pin electronics board and the device then under test. The head includes a microprocessor and firmware associated therewith in which there is stored the various test functions, the timing and the sequencing called for by the special tests to be conducted, the head also being provided with a function generator, a forcing supply and other appropriate testing sources.

The microprocessor of the test head is intercoupled with the main frame computer of the system through a translation module so that data acquired by the special function test head can be translated into the same machine language format that the main frame computer uses to communicate with itself.

OUTLINE OF DRAWINGS

For a better understanding of the invention as well as other objects and further features thereof, reference is made to the following detailed description to be read in conjunction with the accompanying drawings, wherein:

FIG. 2 is a block diagram of the same system when an intelligent test head in accordance with the invention is plugged therein;

DESCRIPTION OF INVENTION

Conventional Computer-Controlled Test System

Figure 1:
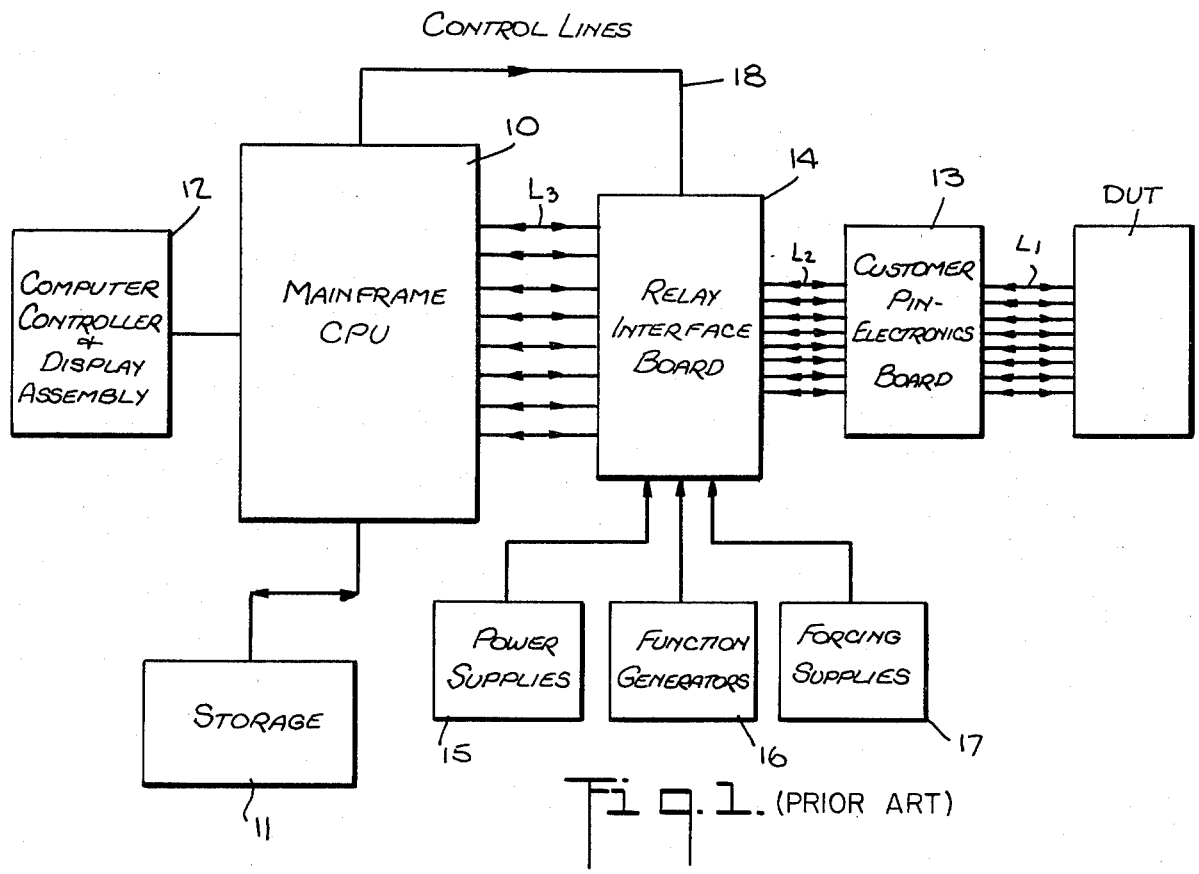
FIG. 1 is a block diagram, in simplified form, of a known form of a computer-controlled automatic test set system.

Referring now to FIG. 1, there is shown the basic elements of a conventional computer-controlled automatic test system adapted to test digital integrated circuit chips, but which may be modified to test linear devices as well. These modifications include the addition of specialized forcing supplies and function generators, as well as extensive modifications to the interface, plus appropriate software.

A digital computer is capable of carrying out arithmetic or logic operations on data entered into its input and of yielding numerical results or decisions at its output. Whether in the form of large-scale, general-purpose computer, a mini-computer or a micro-computer, all digital computers are essentially composed of a central processing unit, a memory system and some form of an input-output device.

The task assigned to a central processing unit (CPU) of main frame 10 is to receive and to store for later processing in memory 11 data in the form of binary digits or bits, to perform arithmetic or logic operations on this data in accordance with previously-stored instructions, and to deliver the results through a read-out device such as a printer or a cathode ray display terminal in controller and display assembly 12.

The central processing unit is that component of the computer which controls the interpretation and execution of instructions. In general, a CPU contains the following elements: "Control" which includes control logic and instructions for decoding and executing the program stored in "Memory"; "Registers" which provide control with temporary storage for bits, bytes or words; an Arithmetic and Logic Unit that performs arithmetic and logic operations under supervision of Control; and Input-Output ports providing access to peripheral devices such as keyboards and cathode-ray display terminals.

The memory system is that component of the computer which holds data and instruction codes, each instruction or datum being assigned a unique address that is used by the CPU when fetching or storing the information. The read-only memory or ROM is a memory adapted to store information permanently, such as a math function or a micro-program (a special purpose program initiated by a single instruction in the system's main program.) A memory that can be programmed by the user, but only once, is known as a programmable ROM or PROM; hence when a PROM is programmed, it then functions as a ROM.

The term read/write memory signifies that the memory is capable of storing information (write) and of retrieving the stored information (read) at an identical or similar rate. In a computer, a random-access memory (RAM) is a read-write memory adapted to store information in such a way that each bit of information can be retrieved within the same amount of time as any other bit.

The capability of a computer depends in good part on the storage capacity of its memory system. The amount of information stored ranges from fewer than 100 bits, as in a simple pocket calculator, to more than a billion bits for a large-scale computer. Integrated-circuit memories based on transistors are designed to store bits of binary digits on a chip.

The basic "hardware" components of a digital computer are the central processing unit (CPU), the memory system and input-output devices. The registers, the control and the arithmetic logic unit of the CPU are linked with the memory system and the input-output device by a data bus; that is, a group of wires that allows the memory, the CPU and the input-output device to exchange signal bits, bytes or words.

The "software" associated with a computer are those expedients by which the computer is explicitly told what to do through a step-by-step sequence of individual instructions which together constitute a program to perform some specific function or to yield a solution to a specific problem. An "instruction" is a group of bits that define a particular computer operation. Thus an instruction may direct a computer to move data, to do arithmetic and logic operations, to control input-output devices, or to make a decision as to which instruction is to be executed next.

Although one may write a complete program in terms of numeric instructions, this task is inevitably tedious. One therefore normally employs assembly language made up of grouped alphabetic characteristics (nmemonics) that take the place of numeric instructions and are easier to remember. For example, in machine language, the instruction "01000001" might tell the computer to clear the "A" register, whereas in assembly language, the nmemonic "CLA" serves the same purpose.

To further facilitate programming, high-level languages have been developed whose instructions more nearly approximate ordinary English or math notation. In FORTRAN, COBOL and BASIC, three commonly-used high-level languages, a single functional statement may translate into a series of instructions in machine language, in contrast to low-level assembly language in which statements translate on a one-to-one basis.

The term "firmware" denotes a computer program or instruction used so often that it is stored in a read-only memory instead of being included in software. A microprogram is an example of firmware, being somewhere between hardware and software in permanence.

In the conventional test system shown in FIG. 1, the device under test (DUT) is connected by lines $L_1$ to the customer's pin electronics board 13 which in turn is connected by lines $L_2$ to a relay interface board 14. This board, through lines $L_3$, acts to link the computer 10 with the DUT and to operatively connect to the DUT testing sources appropriate to the test to be performed.

Thus while FIG. 1 shows power supplies 15, function generators 16 and programmable forcing supplies 17, these are merely representative of such testing sources; for in practice, use may also be made of timing generators, ramp generators, B+ and B− rails, oscillators, sync generators and clocks to perform a variety of tests on either discrete or integrated circuit components under test. The operation of relay interface board 14 is governed by the computer through control lines 18.

Control and display assembly 12 includes software for the system which in practice may be recorded on magnetic tape cartridges and read therefrom by a magnetic cartridge transport. Programming may also be done by way of a keyboard. The programmer and operator communicate with the test system through a CRT terminal in controller assembly 12.

In practice, the test program for the device under test may be written in an English-like symbolic language. The programmer expresses in this language the voltages, the currents, the times, the type of test to be performed, the truth tables to be used for functional tests, the test limits and all other instructions pertinent to the tests. After a program has been prepared, devices are tested either at a manual test station, by an automatic handler, or by whatever other handling means are available to the customer.

In operation, the central processing unit (CPU) in main frame 10 acts both as a supervisor and as a data processor. The test sequencing or pattern is programmed into the computer and stored in memory 11, the pattern being put in either by keyboard or tape. When the handler inserts a device into the test socket for testing, a signal is sent back to the tester and the program is called out of memory.

The CPU then evaluates the test sequencing and latches selected relays in the relay interface board 14, these relays connecting the proper forcing generators, power supplies and other appropriate testing source to the device under test (DUT). The CPU also latches certain other relays which act to connect the sense leads (in the case of a Kelven clip, this is the inside set of connections) on the device under test to the proper function measuring equipment, which is usually a voltage measuring device included in the CPU. At this time, the DUT is being stimulated by the appropriate generators and its performance is being monitored by the CPU. After a predetermined number of operating cycles, the test results are stored in the CPU. These results may be mathematically manipulated in the CPU and may be outputted to a printer/plotter included in the control and display assembly 12.

The foregoing description has been generalized so as to be applicable to virtually all existing types of computer-controlled automatic test systems. Because the CPU in such systems is tailored or dedicated to test one family of devices, it has a limited degree of flexibility. Thus Lorlin's "Data Spec" test system is designed for discrete components such as bipolars, FET's, diodes and Zeners, whereas Teradyne's J 133 D test system is specifically designed to test digital integrated circuits, while Teradyne's T 349 system is expressly intended for field effect transistors. The adaptability of the other functional group—i.e., power supplies, function generators and forcing supplies—is limited by cost, physical dimensions and actual performance constraints, and by CPU communication restrictions.

Referring again to the customer's pin electronics board 13, it is to be noted that the structure of this board is integral with the automatic test system, its purpose being to provide the user with pin access to the device under test so that special trimming and "tweaking" can be done on the DUT family. The board generally employs active circuitry and functions as a highly specialized generator. Impedance matching networks, pulse generators, wave shapers and other items not available through the main frame supplier or required items peculiar to a particular device being tested may be mounted on this board.

The Intelligent Test Head

Referring now to FIG. 2, there is shown an intelligent test head 19 which, when plugged in, is interposed in the signal path between the device under test DUT and pin electronics board 13 of the automatic test system. The components of the system are identified by the same reference numerals as used in FIG. 1. Test head 19 is linked to the main frame 10 by data and control lines 20.

Figure 3:
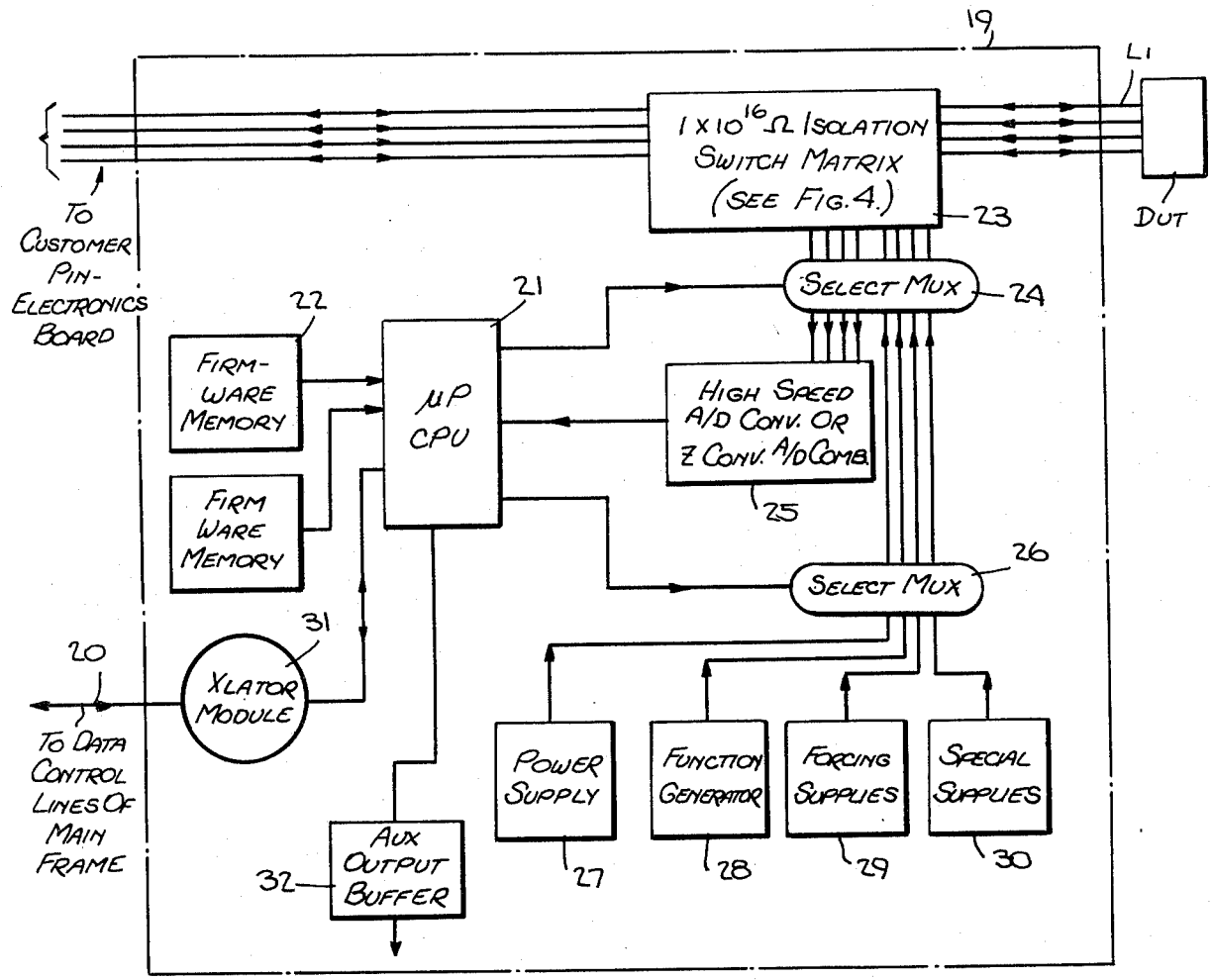
FIG. 3 is a block diagram showing the essential elements of the test head.

As shown in FIG. 3, test head 19 incorporates a microprocessor 21 associated with two firmware memory stages 22 and 23 which provide programs appropriate to the specialized tests to be carried out on the device under test. When plugged in, test head 19 is interposed in lines $L_1$ from the DUT to the customer's pin electronics board 13 by way of an isolation switch matrix 23 (shown in greater detail in FIG. 4). Switch matrix 23 is coupled through a multiplex selector 24 whose operation is controlled by microprocessor 21 to a high speed analog-to-digital (A/D) converter 25 which, in practice, may take the form of an impedance converter and A/D combination. The output of converter 25 is applied to microprocessor 21 to supply thereto in digital form the analog information derived from the DUT.

Microprocessor 21 also controls the operation of a second multiplex selector 26 which operates to couple appropriate testing sources represented by power supply 27, function generator 28, forcing supply 29 and special supply 30 to the device under test, the link being through the first selector 24 and switch matrix 23.

Microprocessor 21 communicates with the main frame computer 10 through a language translator module 31 connected to data and control lines 20. An auxiliary output from the microprocessor is taken through a buffer 32.

The duties of microprocessor 21 are to maintain housekeeping, to supervise the execution of all tests and the timing and sequencing thereof, to maintain and monitor forcing functions, oscillator frequencies, etc., thereby controlling the test head so that it executes its test sequencing at the proper time when called upon to do so by the main frame computer 10.

The data acquired by the microprocessor is reformated by the translator module 31 into the same machine language format used for communication in the main frame computer of the automatic test system for which the test head has been designed. This eliminates communication, timing and sequencing problems of the type encountered when seeking to get a large main frame computer to carry out a task for which it is not designed. Because of this approach, software rewrite requirements for the main frame test computer are minimal.

Since test head 19 has its test sequencing and cycling stored in firmware stages 22 and 23, it already knows what it needs to do to execute a special test. Hence main frame computer 10 has only to call it up on line. In practice, this call-up entails only a single coded command in a form recognized by test head microprocessor 21. It need not be recognizable or meaningful to the main frame computer.

At the conclusion of its test cycle, microprocessor 21 in the test head enters the resulting data in a latch for the main frame computer to strobe out. An end-of-test-sequence command is then transmitted to the main frame computer by the test head which it will read. Under the control of its software, the main frame computer will now go on to the next step in its program. This may be a step in which the information from the test head is strobed out and manipulated in data processing, or which initiates another test on the DUT and disregard the results of the previous test until it needs this data at a subsequent point in time.

The value of a test head in accordance with the invention resides in the fact that all test functions and forcing functions as well as timing and sequencing are stored in its firmware, so that it is capable of carrying out highly specialized tests that cannot otherwise be performed by the automatic test system into which the test head is plugged. Thus the test head which includes its own microprocessor acts as a separate entity that is independent of the main frame tester. The processing capability of test head 19 is obviously limited to the tasks for which it has been designed. This limit is quite arbitrary and can be readily expanded by adding more ROM's or RAM's.

In practice, test head 19 can be made accessible to software, but this is generally not necessary. Its auxiliary output from buffer 32 may be used to drive plotters and printers, and other peripherals for either mass data storage or graphics display. Because of the data processing capability of the test head, pre-programmed GO/NO-GO limits may be stored in the firmware to simplify the data outputted to the main frame computer.

That is to say, the test head acts to test the transistor or integrated circuit for the specialized parameter to which it has been tailored, it takes the data resulting from the test and compares it with pre-programmed limits and it feeds a GO or NO-GO signal back to the main frame computer based on its comparison of the acquired data against the pre-programmed limits. This makes possible a more rapid total test cycle; for then the main frame computer need not read and analyze large amounts of data. This somewhat complicates firmware programming for the test head, but it simplifies the software programming for the main frame.

Though the test head functions as an independent testing unit, it must plug into the main frame computer. But because the test head incorporates its own testing sources (forcing, function, power supplies, clocks, sync generator, frequency synthesizers, etc.), it is capable of performing all tests for which it is designed regardless of the existence of the main frame. While the test head performs all of its functions by itself as a stand-alone unit, it has no built-in facilities for operator evaluation of the test data. Such evaluation takes place in the associated automatic test system. The test head yields as an output digital data and, in some instances, analog representations thereof. However, this output takes the form of an electrical signal and not directly interpretable test results; for such interpretation takes place in the main frame computer which may evaluate the test head data along with other sets of data acquired by the main frame computer from the device under test.

Switch Matrix

Figure 4:
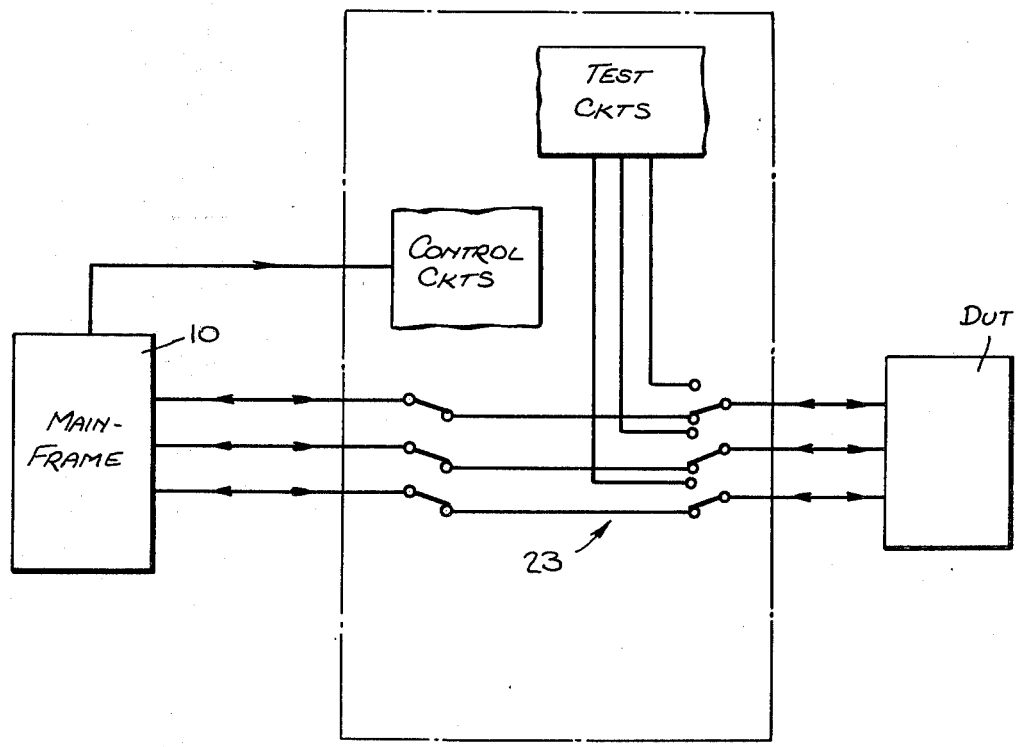
FIG. 4 illustrates the switching arrangement included in the test head.

As shown in FIG. 4, switch matrix 23 is provided with a bank of high-impedance isolation switches, such that when the test head is not called up by the main frame computer (off-line) it isolates itself both from the device under test and the main frame computer by an extremely high impedance in the order of $1 \times 10^{15}$ ohms or $1 \times 10^{16}$ ohms. Subsequently, when the main frame calls up the test head with a TTL or BCD or machine language command, the microprocessor recognizes the command signal and calls out the appropriate test sequencing and functions from its own firmware storage. At this point the test head knows which particular pass-through switches to isolate and which have to be connected to the main frame. In this way, the test head and the DUT may be completely isolated from the main frame by an extremely high impedance.

Figure 5:
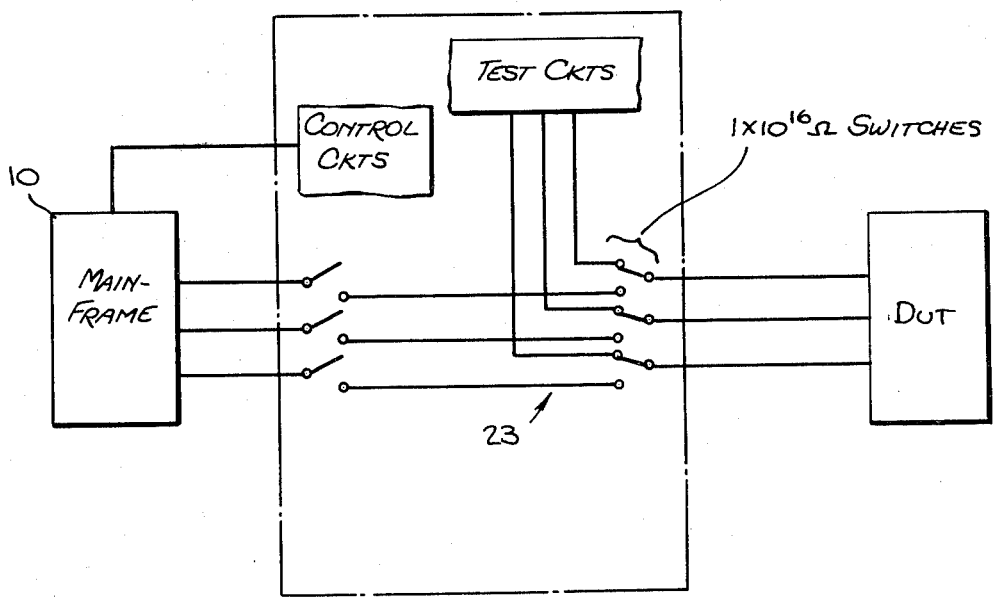
FIG. 5 illustrates the switching arrangement in effect when the test head has isolated itself from the main frame computer.

FIG. 4 shows the DUT connected by switches 23 in the matrix to main frame 10, so that the test head is disconnected therefrom, whereas FIG. 5 shows how the test head has isolated itself from the main frame after the test head has received a call-up command. In this manner, the test head can run precision testing on the DUT without electrical interference from the automatic test system with which the test head is associated and without the main frame receiving spurious or confusing signals from the DUT because of stimulus from the test head.

With respect to transient noise which might interfere with low level measurements, test head 19 may be optically isolated by means of photocouplers or similar means (not shown) from the automatic test system, the photocouplers being inserted in the data and control lines 20 so that the test head is in communication with the main frame, yet electrically disconnected therefrom.

While there has been shown and described a preferred embodiment of an intelligent test head for automatic test system in accordance with the invention, it will be appreciated that many changes and modifications may be made therein without, however, departing from the essential spirit thereof. Thus the test head need not necessarily be interposed between the device under test and a pin electronics board as shown in FIG. 2, but could be otherwise coupled to the main frame computer.

I claim:

1. In combination with a computer-controlled test system for carrying out certain standard tests on integrated circuits and other micro-electronic devices, said computer-controlled test system being provided with a main frame computer having a predetermined operative language and a pin electronics board for linking a device under test to the computer through a relay interface which acts to couple selected testing sources to the device which are appropriate to the normal test capabilities of the computer-controlled test system; an intelligent test head which is adapted to be plugged into the computer-controlled test system to render it capable of executing special tests which the system cannot otherwise perform; said test head, when plugged in, being interposed between the device under test and the pin electronics board of the computer-controlled test system, said test head comprising:

A a microprocessor under the control of said main frame computer and a translator through which the output data of said microprocessor is fed into said main frame computer whereby the output data entered into the computer is translated into said operative language to enable evaluation of this data by the computer for processing therein;

B firmware connected to said microprocessor and provided with a memory having stored therein test functions, timing and sequencing instructions appropriate to said special tests;

C a group of separate testing sources for carrying out said special tests; and

D switching means controlled by said microprocessor in accordance with the instruction supplied by said firmware to connect sources selected from said group to said device under test to carry out said special tests, and means to supply the output of said device resulting from the special tests in digital terms to the input of the microprocessor.

2. In the combination set forth in claim 1, wherein said switching means includes high-impedance switches to isolate said test head from said system when said special tests are being conducted.

3. In the combination as set forth in claim 1, wherein said group of testing sources includes a function generator.

4. In the combination as set forth in claim 1, wherein said group of sources includes a forcing supply.

* * * * *